(12) United States Patent
Barrett et al.

(10) Patent No.: US 7,898,153 B2
(45) Date of Patent: Mar. 1, 2011

(54) ACTUATOR

(76) Inventors: Ronald Martin Barrett, Lawrence, KS (US); Paolo Tiso, Varese (IT)

( * ) Notice: Subject to any disclaimer, the term of this patent is extended or adjusted under 35 U.S.C. 154(b) by 264 days.

(21) Appl. No.: 11/795,830

(22) PCT Filed: Jan. 25, 2005

(86) PCT No.: PCT/NL2005/000054
§ 371 (c)(1),
(2), (4) Date: Jun. 16, 2008

(87) PCT Pub. No.: WO2006/080832
PCT Pub. Date: Aug. 3, 2006

(65) Prior Publication Data
US 2009/0096325 A1 Apr. 16, 2009

(51) Int. Cl.
*H01L 41/08* (2006.01)
(52) U.S. Cl. .......................... 310/330; 310/331
(58) Field of Classification Search .......... 310/331, 310/330, 328, 338, 332, 342, 348, 354, 346; 29/25.35; *H01I 41/08*
See application file for complete search history.

(56) References Cited

U.S. PATENT DOCUMENTS

| | | | | |
|---|---|---|---|---|
| 5,973,441 A | * | 10/1999 | Lo et al. | 310/330 |
| 6,236,143 B1 | * | 5/2001 | Lesieutre et al. | 310/331 |
| 6,665,917 B2 | * | 12/2003 | Knowles et al. | 29/25.35 |

* cited by examiner

Primary Examiner — Walter Benson
Assistant Examiner — Karen Addison
(74) Attorney, Agent, or Firm — Haverstock & Owens LLP (57) ABSTRACT

Actuator comprising:
a) a support beam
b) a first means for placing said support beam in compression without causing flexure of said support beam;
c) a first layer of material adhered to a first surface of said support beam and
d) a second means for causing movement of said first layer of material to cause a flexure of said layer of material and said support beam, wherein said first layer of material evidences a thermal coefficient of expansion that is different than a thermal coefficient of expansion of said support beam, wherein the actuator is designed to operate at a first working temperature whilst the first layer of material is structurally connected to the support beam at a second temperature wherein the second temperature is higher than the first temperature so as to cause that at the first temperature the said support beam is in compression without causing flexure thereof.

20 Claims, 12 Drawing Sheets

ACTUATOR

CROSS-REFERENCE TO RELATED APPLICATIONS

Not Applicable.

STATEMENT REGARDING FEDERALLY SPONSORED RESEARCH OR DEVELOPMENT

Not Applicable.

THE NAMES OF THE PARTIES TO A JOINT RESEARCH AGREEMENT

Not Applicable.

INCORPORATION-BY-REFERENCE OF MATERIAL SUBMITTED ON A COMPACT DISC

Not Applicable.

FIELD OF THE INVENTION

This invention relates to actuators.

BACKGROUND OF THE INVENTION

The invention relates to an actuator comprising:
a) a support beam
b) a first means for placing said support beam in compression without causing flexure of said support beam;
c) a first layer of material directly or indirectly adhered to a first surface of said support beam and
d) a second means for causing movement of said first layer of material to cause a flexure of said layer of material and said support beam, wherein said first layer of material evidences a thermal coefficient of expansion that is different than a thermal coefficient of expansion of said support beam.

Such an actuator is known from the U.S. Pat. No. 6,236,143.

It is an object of the invention to improve the actuator known from U.S. Pat. No. 6,236,143 and to attain further advantages that will become apparent from the following discussion.

BRIEF SUMMARY OF THE INVENTION

The actuator according to the invention is characterized in that the actuator is designed to operate at a first working temperature whilst in a preceding manufacturing process the first layer of material is structurally connected to the support beam at a second temperature wherein the second temperature is higher than the first temperature so as to cause that at the first temperature the said support beam is in compression without causing flexure thereof.

The actuator according to the invention endures significantly higher deflexion levels than is possible with the actuator according to the state of the art.

A further distinguishing feature of the actuator according to the invention is that at least on the side of the first layer of material facing away from the support beam a stiff facing ply is applied.

Such a stiff facing ply engages the first layer of material when it is curved due to tensioning of the actuator. As they engage, the elastic axis is shifted towards the face which is going into tension thereby absorbing the tensile loads and relieving the tension critical actuator elements.

To aid the shifting of the elastic axis the actuator according to the invention is further characterized by the feature that between the first layer of material and the stiff facing play a separating non-stick layer is applied.

This non-stick layer tends to more gradually engage the tension load carrying capability of the facing sheet thereby allowing for a more gradual transition and shifting of the elastic axis through the thickness of the actuator.

Advantageous embodiments in which the actuator can be employed are provided by claims 4 and 5 respectively.

In the following the actuator according to the invention will be described in relation to preferred embodiments without however intending to limit the scope of protection to the discussed embodiments.

DETAILED DESCRIPTION OF THE INVENTION

Figure 1:
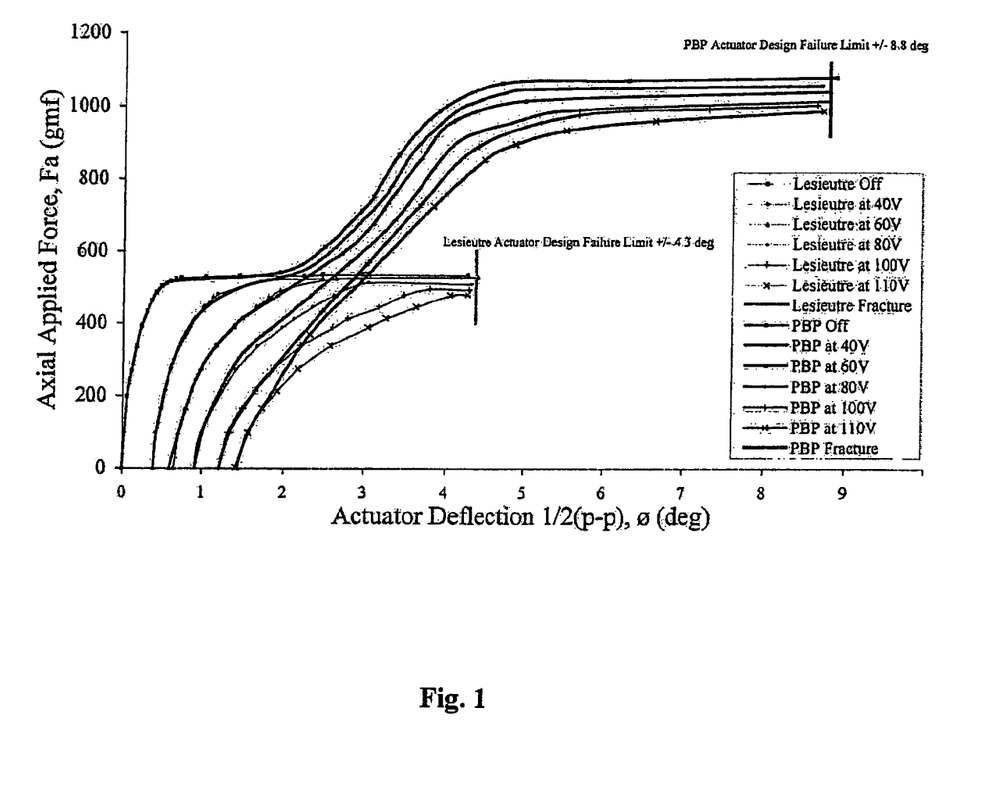
FIG. 1 shows a performance of the actuator according to the invention compared to the actuator known from U.S. Pat. No. 6,236,143 indicated with 'Lesieutre'.
Figure 2:
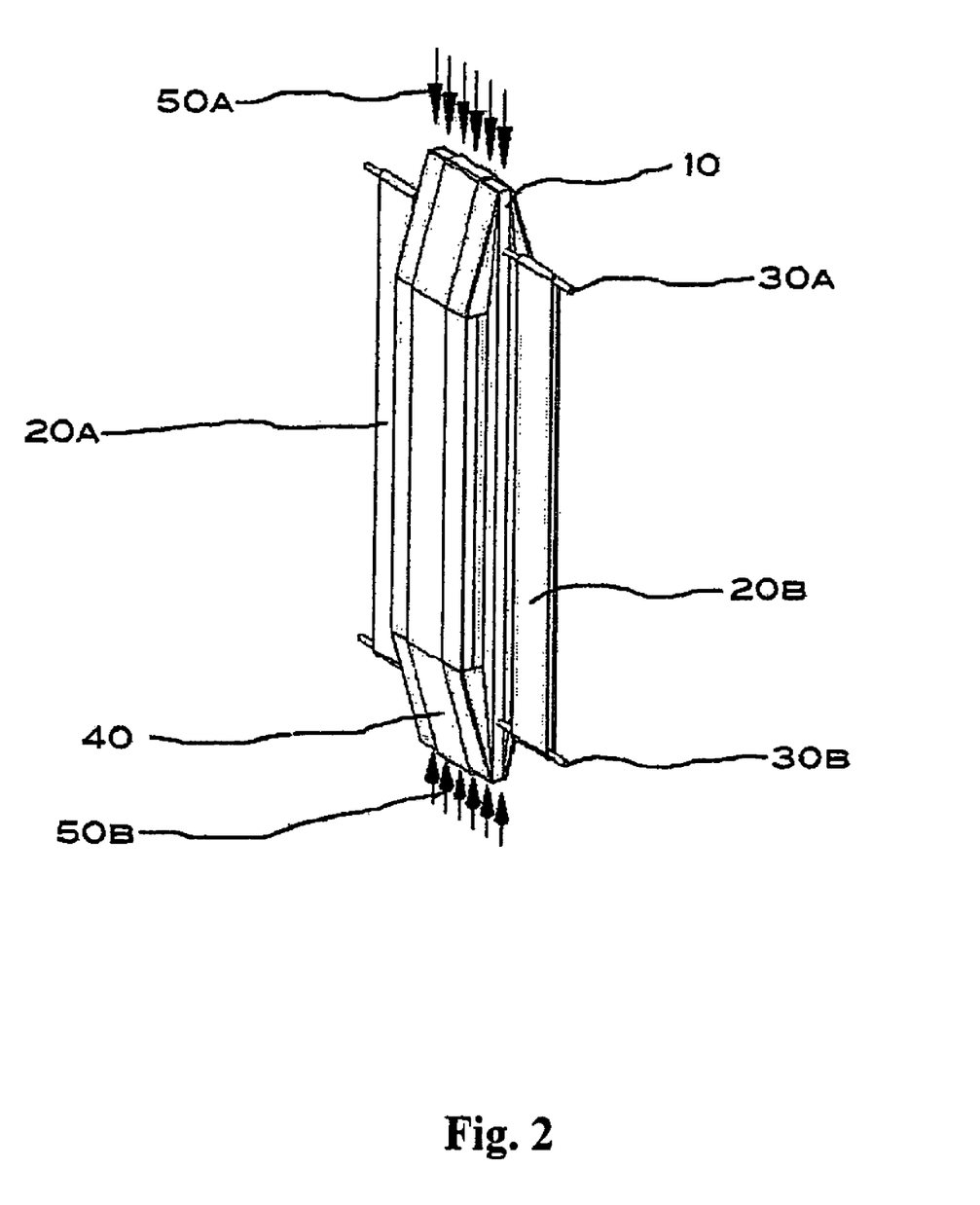
FIG. 2 represents a schematic drawing of the actuator element according to the invention.

From FIG. 1 representing results from experiments, it can clearly be seen that the actuator of the invention allows a simultaneous doubling in both force and deflection levels seen in a given adaptive bender element undergoing axial precompression. The end rotations shown in FIG. 1 are more than twice the levels experienced in the Lesieutre specimen. The total actuator deflection levels are more than doubled. A detailed examination of the actuator structure is provided hereafter. FIG. 2 shows representative actuator components in a generic actuator of the invention.

The actuator element is built on a backbone of a support beam or substrate 10. This substrate may be composed of any suitable structural material, but is most commonly fashioned from steel, aluminium or titanium foil or graphite-epoxy composite sheets. It should be noted that this substrate should possess a higher coefficient of thermal expansion than the first layer of material or active elements adhered to the support beam 10 so that when the structure is cured at an elevated temperature, the actuator elements are placed in compression once the element is cooled to an operational temperature. Parallel to the substrate may be a pair of lateral prebuckling springs or elastic bands 20. These bands provide a prebuckling force and may or may not be used in conjunction with any of the other prebuckling axial loading methods. The prebuckling bands are attached to the substrate via attachment pins 30 which transfer loads and allows for unrestricted rotations. In addition to the lateral pre-compression bands, central prebuckling band(s) 40 may also be used. These band(s) loop completely over the element and impart the same sort of prebuckling forces as the lateral prebuckling bands. It should be noted that each of these bands may be composed of any suitable material which allows for spring-like behaviour to generate prebuckling forces. These bands or springs may be composed of steel, aluminium or other isotropic metals or (more commonly), elastic rubbers which allows for large strains and deformations. These springs may be flat, round or other sort of irregular shape in cross section and may be monolithic or stranded. The important characteristic is that controlled axial forces be imparted via the attachment pins or the actuator ends. The final and more generic forcing element of the actuator of the invention comes from prebuckling end forces 50 which are generated by as yet to be described mechanisms. These mechanisms are specific to the exact actuator class, size and operational characteristics, but may be introduced via any number of mechanisms. Because there are so many permutations of possibilities of end forcing ranging from fixed end blocks with axial springs to pneumatic to electromechanical and even adaptive actuators, these prebuckling end forces are simply represented as a series of axial arrows oriented vertically showing that the actuator element is loaded in axial compression so as to induce a controlled buckling deformation as varying levels of imperfections are introduced.

FIG. 2 shows the salient external components of a generic pin-pin type actuator element. It should be noted that cantilever and fixed-fixed structural arrangements with flexural members are degenerate forms of the pin-pin actuator shown in FIG. 2.

Figure 3:
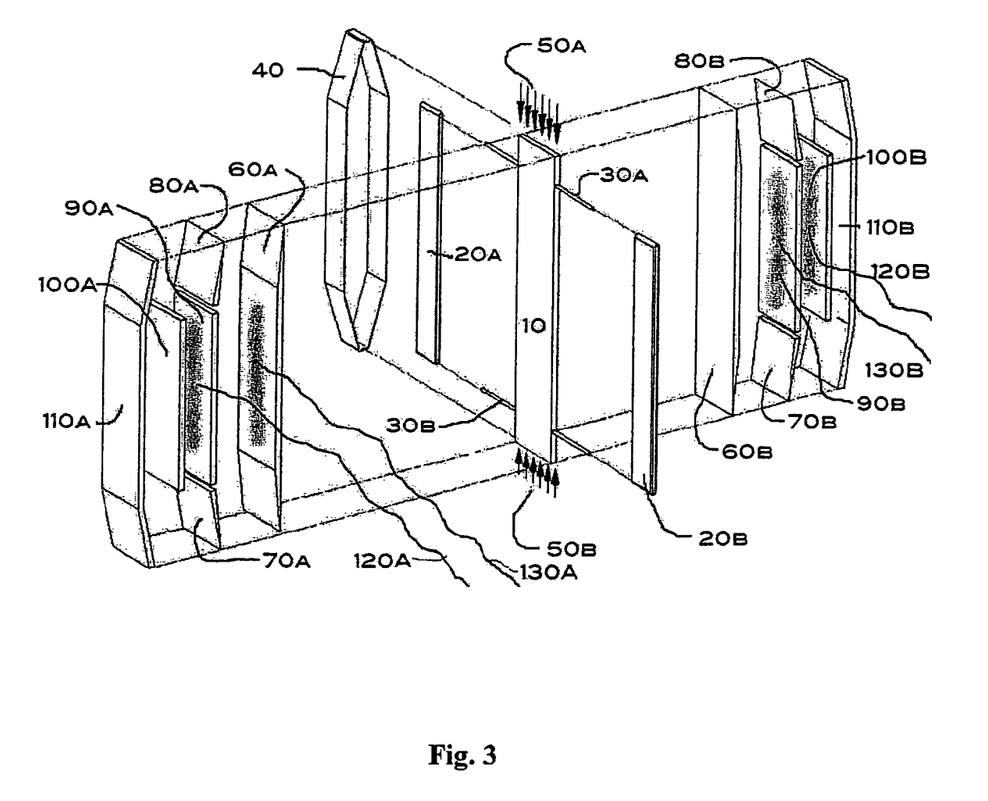
FIG. 3 shows an exploded view of the actuator according to the invention.

The actuator element shown in FIG. 2 contains many more components than can be seen in an assembled device. Accordingly, FIG. 3 shows the principal members in an exploded view. From FIG. 3, it can be seen that resin layers 60 are placed on either side of the substrate 10 and join the first layer of material representing the active elements 90 both structurally and mechanically. The active elements 90 may be composed of any material which changes its shape as a function of a given stimulus. This active element may be piezoelectric, electrostrictive, shape-memory alloy, or simply thermally activated via a mismatch in coefficient of thermal expansion with respect to the support beam or substrate 10. The active elements 90 are held in place via the resin layer 60 and two resin end bonds 70, 80, each of which transfers shear forces from the element to the substrate and visa versa.

The outer faces of the active elements 99 are preferably coated or covered with a non-stick layer 100 so as to prevent facing plys 110 from sticking to it and providing structural support as a given face goes into compression during concave bending motions. This feature allows the facing plys 110 to shield the active elements 90 on the tension faces by effectively shifting the elastic axis towards the convex side of the actuator.

Attached to each side of the actuator are electrical leads 120, 130. The leads may be composed of monolithic or multi-strand wire, conducting sheets or foils. The leads may be connected to either side of the actuator via strips of conducting material 140, 150. This conducting material may be made from various grades of conducting epoxies, solder or other conductive substances. It should be noted that the leads on either face may or may not be present as shown, but represent a preferred embodiment. The most important salient characteristic described in FIG. 3 is that some form of electrical connection is made to the active element in case the active element is electrically activated. Should the active element be made from a material which is activated via magnetic fields, changes in local Ph, changes in temperature or other such stimulation method, then the electrical leads can be dispensed with. It should also be noted that any form of position sensor such as strain gages may or may not be used in conjunction with the actuator.

Although FIG. 3 shows a symmetric actuator element, it is perfectly possible to construct an actuator which does not possess symmetry about the substrate mid-plane. Such an actuator may be preloaded in any of a number of conditions so as to eliminate the need for symmetry.

Figure 4:
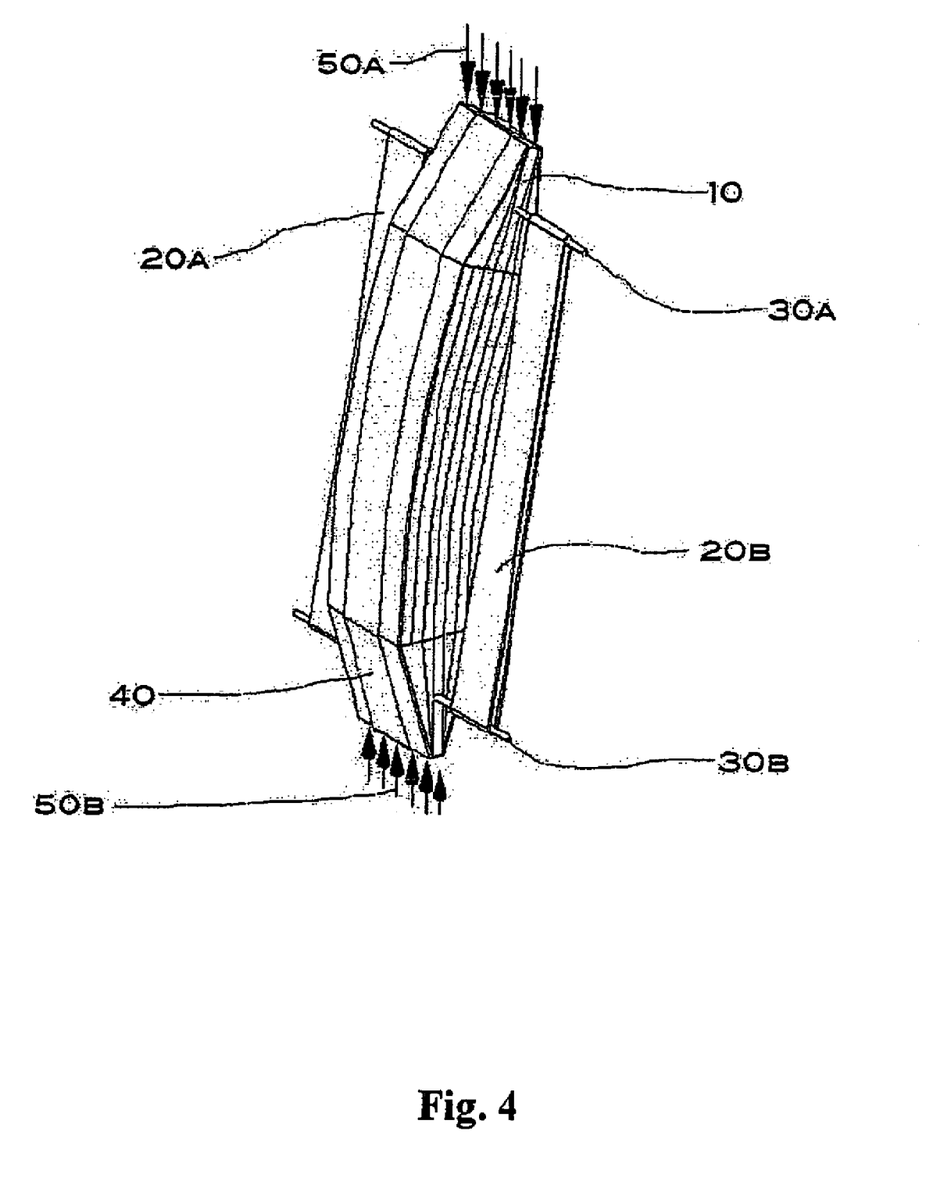
FIGS. 4 and 5 show the assembled and exploded views of the actuator according to the invention undergoing activation.
Figure 5:
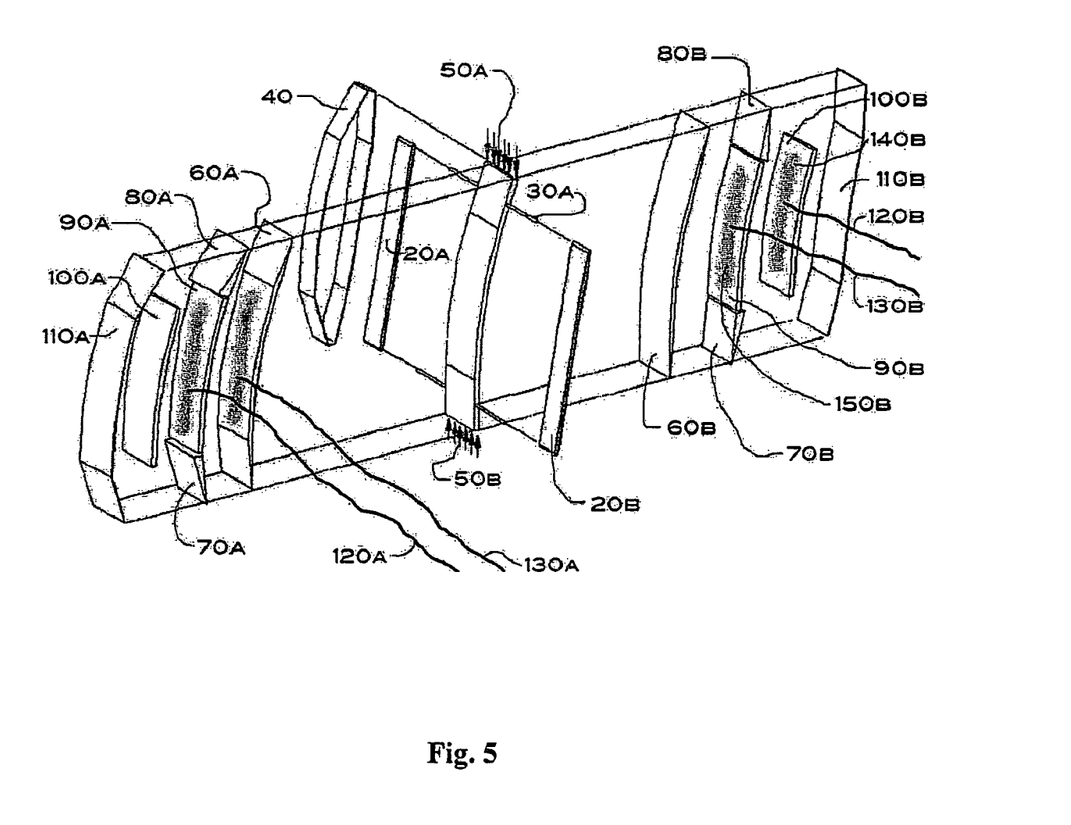

During activation, the various components of the actuator will behave in different manners and will selectively accept or reject the carriage of loads while undergoing deformations. FIGS. 4 and 5 show the assembled and exploded views of an actuator of the invention which is undergoing activation.

To initiate the activation, an imperfection is generated by the active elements 90. This imperfection is typically commanded by issuance of an "extension" command to active element 90A and a "contraction" command to active element 90B. The resulting mismatch between the strains in 90A and 90B induce bending loads which produce convex curvatures on the "side A" components and concave curvatures on the "side B" components. From FIG. 5, it can be seen that the substrate 10, resin 60, 70, 80, separation ply 100 and facing sheet 100A all act to resist the bending moment generated by the active elements 90 and the prebuckling loads introduced by the prebuckling bands (or springs) 20, 40 and the axial prebuckling forces 50. The compressive side of the element B shows a single completely buckled element, the facing sheet 110B. This facing sheet has buckled in a higher mode and is essentially providing no significant stiffness or strength to the actuator element. Because the facing sheet 110B no longer participates in the structural characteristics of the actuator, the elastic axis is effectively shifted towards the tension side of the actuator (A), thereby relieving the tension critical actuator element (90A) from such high tensile stress loads. The participation of the convex facing sheet (110A) is such that added tensile stresses are invested in that element, thereby further relieving element 90A. It should be noted that the engaging of the facing ply 110 can be anticipated or retarded by a proper design of non-stick layer 100. It should further be noted that typically such actuator elements and constituents are of dramatically higher aspect ratios (length, or width divided by thickness) than shown in the figures. However, exaggerated thicknesses are shown in the figures for clarity.

The joining of such elements may be had via any resin system or even structural solder, braze of other method of joining. A preferred material combination includes an aluminium support beam or substrate 10, bonded to piezoceramic actuator elements 90 via a layer of high shear strength epoxy resin with a strip of conducting epoxy in the middle of the epoxy layers 60. The end bonds 70, 80 are formed via resin dams formed during the cure process. The separation plys 100 are formed from thin layers of Teflon and the facing plys or sheets 110 are steel. It should be noted that although this is a preferred embodiment, variations in thickness and width distribution will yield optimal results for many different configurations. Such thickness distributions may include, for instance, parabolic and circular-arc thickness distributions.

Once the fundamental actuator element is assembled, it can be further integrated into a host of different structures. Although far from being the only family of applications, the field of aeronautics provides fertile ground for such a useful actuator class. The first embodiment of the actuator of the invention shown here is in a generic "plain flap" type actuator.

Figure 6:
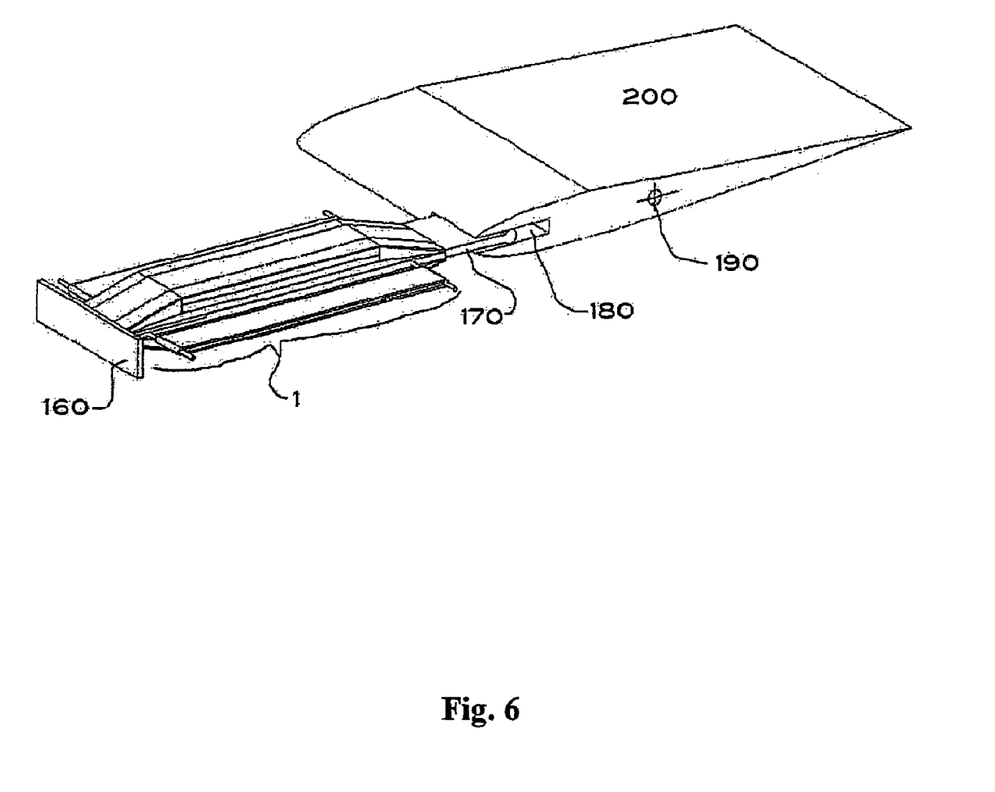
FIGS. 6, 7 and 8 shows how the assembled actuator according to the invention can be used to drive a flap in pitch.

FIG. 6 shows how the assembled actuator 1 would be used to drive a hypothetical flap in pitch.

The actuator 1 is connected to a structural element within a fuselage or wing such as a spar, longeron, bulkhead or torque box via an end attachment 160. As the actuator is commanded to bend, a vertical force, either upward or down-ward is imparted to the end extension 170 which will pitch the flight control surface 200 about the pivot line 190. The end extension slot 180 allows for forward and afterward movement of the tip of the end extension 170 so as to prevent geometric binding. It will be noted that a round bearing surface is designed on the end of the end extension 170 which will make contact with the walls of the slot. The thickness of the slot, round bearing and end extension are designed to exactly accommodate the design rotational deflections. This means that as the aerodynamic surface reaches its rotational limits, the top and bottom of the end extension 170 and the round bar will geometrically seize on a component within the slot preventing further rotation, thereby providing an over-rotation protection mechanism. Other overrotation mechanisms are easy to envision such as lateral pins and bump stops. However, given that they are so numerous and well known in the field, it is superfluous to include further mechanisms here.

Figure 7:
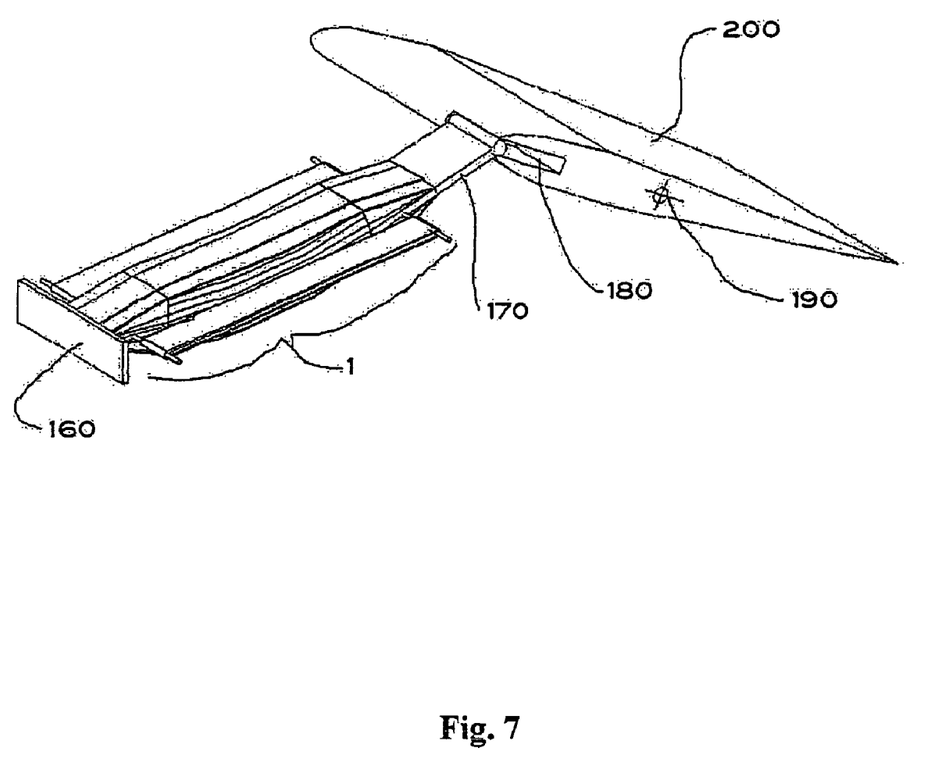
Figure 8:
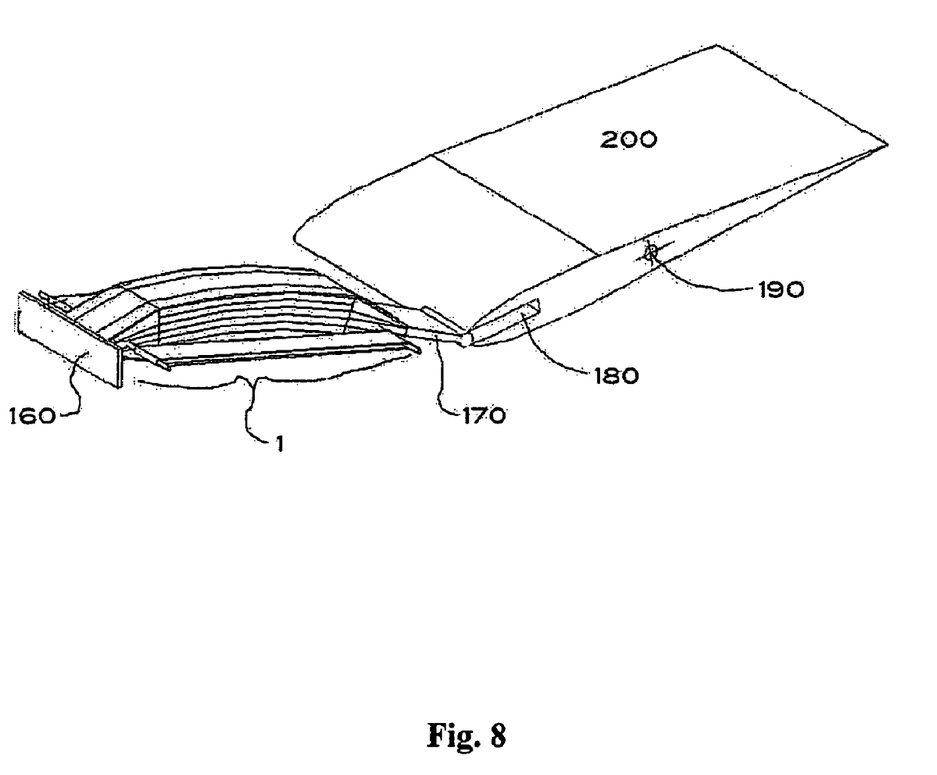

Care should be taken during the design of such structures to properly place the pivot line 190 so that it coincides with a favourable location for balancing pitching moments. In subsonic aerodynamic mechanism designs, that location will be close to the quarter-chord of the mean geometric chord of a free-flying aerodynamic surface. For attached control mechanisms such as plain flaps, ailerons, elevators and rudders, that location will be closer to the ⅓ chord of the mean geometric chord of the aerodynamic surface. For supersonic aircraft, that point will lie in the vicinity of the ½ chord of the mean geometric chord of the aerodynamic surface. In any case, the aerodynamic surface should also be mass balanced so that the line of centres of gravity coincide with the pivot line and the line of aerodynamic centres or the aerodynamic centre of the mean geometric chord of the lifting surface (if free flying). FIGS. 7 and 8 show the aerodynamic surface undergoing pitch deflections nose up, then nose down as commanded by the actuator.

Figure 9:
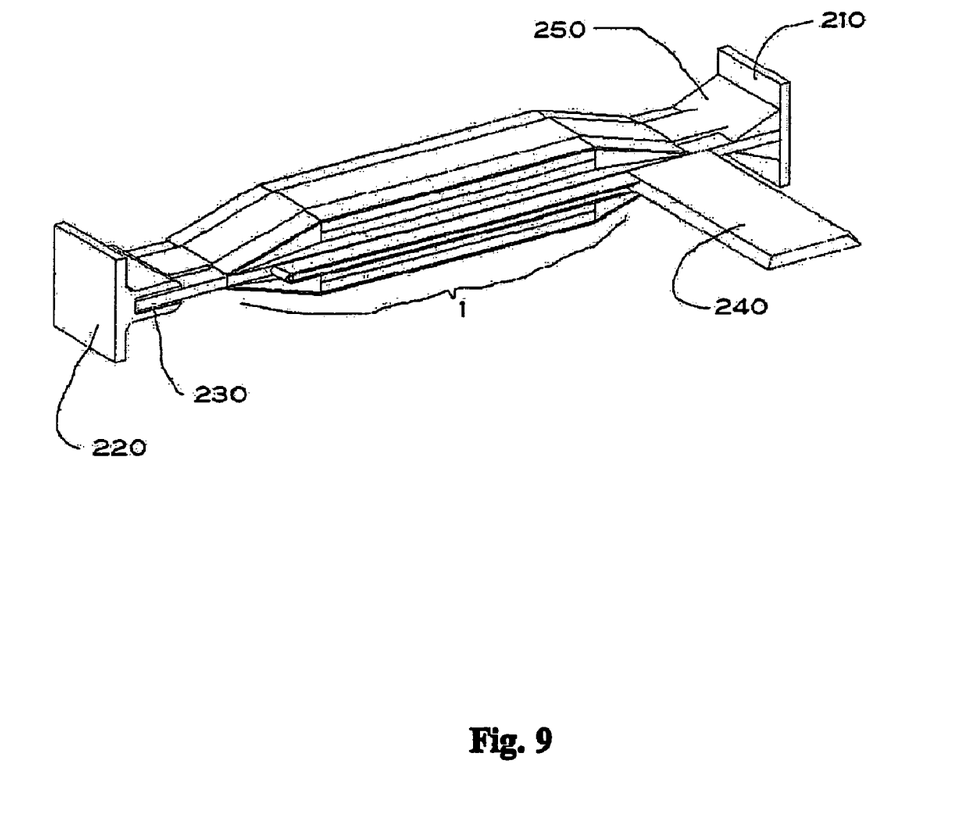
FIG. 9 shows a preferred embodiment of an actuator according to the invention used for flight control with solid state flexures.

If one considers ever higher speed applications, it becomes critical to move aerodynamic surfaces more precisely over lesser rotations. To accomplish this, the actuator of the invention can be attached to control surfaces directly without mechanical amplification as shown in FIGS. 6-8. The directly connected variant of the actuator of the invention can be attached to subsonic or supersonic flight control surfaces. FIG. 9 shows a preferred embodiment of the direct connection flight control actuator with solid state flexures.

From FIG. 9 it can be seen that several different components are used to both support and precompress the actuator element 1. The configuration of the actuator as shown in FIG. 9 is the preferred embodiment of a "tactical" actuator (i.e. one that could be used in very robust flight control systems). The configuration of supports and flight control mechanisms shown in FIG. 9 are compatible with applications that will be exposed to many hundreds and even tens of thousands of g's of accelerations in the longitudinal axes. The actuator shown in FIG. 9 can be used on both inhabited and unhabited aircraft, missiles and munitions. Several families of munitions which could take advantage of the actuator class include the newly pioneered "guided bullets" and "guided cannon shells."

Figure 10:
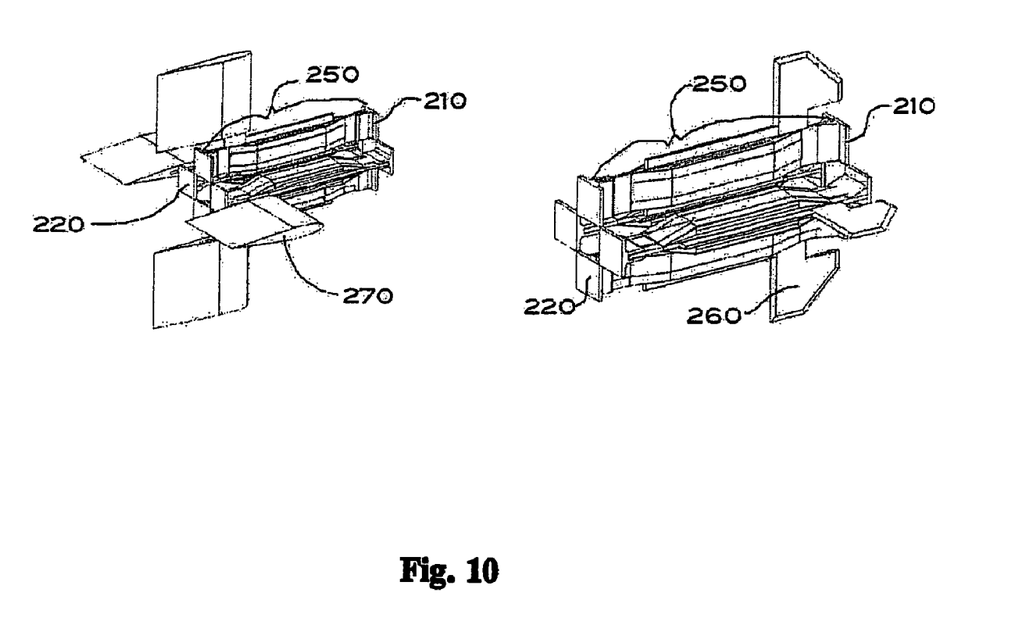
FIGS. 10, 11, and 12 show some further embodiments based on the assembly shown in FIG. 14.

The principal components of the actuator in this tactical configuration as shown in FIG. 9 include the actuator element 1, a forward bulkhead mount 210, base structural mount 220, elastomeric compression bushing 230, aerodynamic control surface stub 240 and a forward structural fillet 250. The forward bulkhead mount is used to mount the actuator to the principal structure of the actuator bay. This structural member, typically a bulkhead, will transfer longitudinal accelerations to the actuator during launch which could range up through many tens of thousands of g's. The forward structural fillet 250 dissipates and transfers these "setback acceleration" loads more gradually to the contiguous substrate which will form the main tension-load carrying member of the actuator. "Setforward acceleration" loads will be carried in tension by the base structural mount 220. This mount is typically placed at such a position so as to impart a net compressive force on the actuator 50 so as to induce a prebuckling load. However, during setforward accelerations, the mount is designed to carry tension loads as well. During setforward accelerations, the forward portion of the substrate can buckle locally and relieve excess compressive stresses experienced by the element. The compression bushing 230 may be made from an elastomeric material, rubber, plastic, isotropic metals or even composites. The compression bushing typically transfers gradual compression loads to the actuator 1 during normal flight operations. However, during setback accelerations, the compression bushing 230 allows the substrate to compress to a position close to the bottom of the base structural mount 220, allowing a highly constrained and flat actuator position. As the actuator encounters setforward accelerations, it transfers the loads in the opposite direction, thereby supporting the actuator from the rear end in tension. Ringing loads are damped out by the inherent damping properties of the compression bushing 230 which should be made of a material with a high damping coefficient. If one gangs several of the actuator assemblies shown in FIG. 9 together into flight control packages, then flight control bays can be designed as shown in FIG. 10.

The complete tactical actuator 250 may be assembled in sets of two, three or four and linked mechanically or electrically to control the aircraft in pitch, roll or yaw. If the aircraft to be controlled uses fins for flight control, then the afterward flexure flight control configuration may be used to drive either subsonic or supersonic fins (270). If the aircraft uses canards for flight control, then a canard set can be designed with forward flexures to drive canards 260. In either case, the fins or canards may be designed with subsonic or supersonic aerodynamic sections. Proper aerodynamic designs must be executed so that the pitching moments of the flight control surfaces are minimized by correct placement of the control surface forward and aft with respect to the centreline of the flexural joint in the actuator. In addition to flexural joints, other additional structural supports such as roller or sleeve bearings may also be used to absorb aerodynamic loads.

Figure 11:
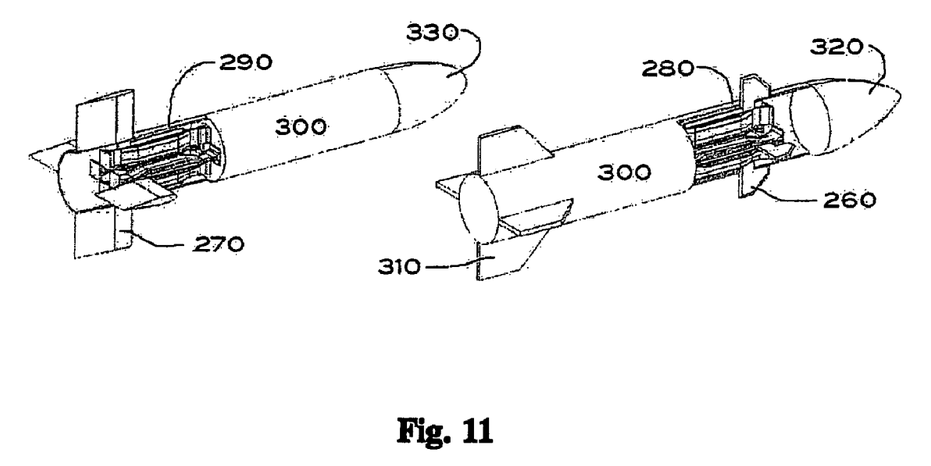
Figure 12:
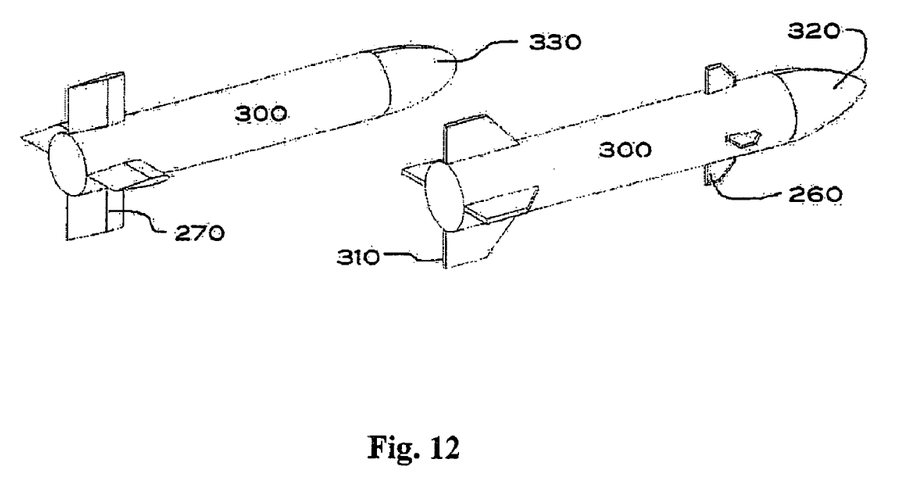

Further integration of the actuator bays into aircraft is shown in FIGS. 11 and 12. Considering a fin controlled aircraft, the actuator bay 290 will accommodate the actuator sets. Because a considerable amount of volume is available between the actuators, mission packages or structural members may be placed there. The central fuselage 300 carries loads up to the nose cone 320, 330. If a canard configuration is used, then the actuator bay 280 will be mounted much further forward and will be used to generate pitch and yaw commands.

Figure 13:
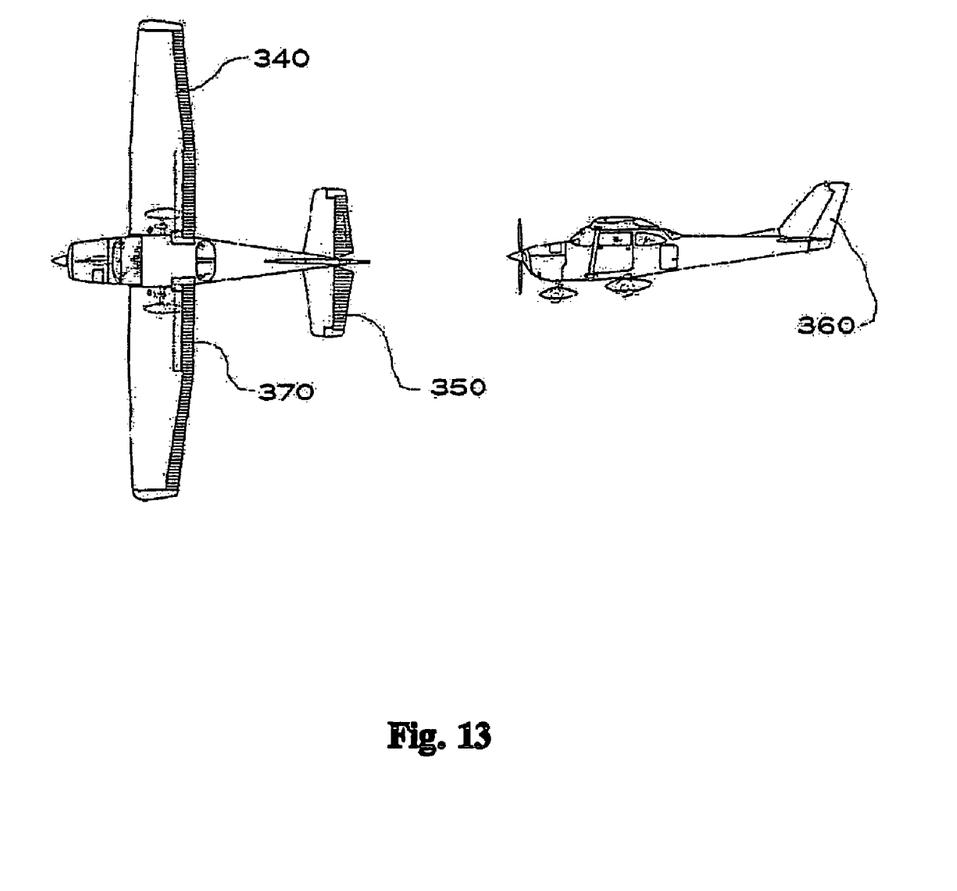
FIG. 13 shows several application places of the actuator according to the invention in a conventional aircraft.

Although well suited toward missile, munition and uninhabited aerial vehicle (UAV) flight control, the actuator of the invention can also be used to control conventionally configured aircraft. FIG. 13 shows the candidate locations where such actuators may be used. Through proper design, integration and development, the ailerons 340, elevator 350, rudder 360 and/or flaps 370 may be driven by such actuators. The actuators may be mounted internal to the flight control surface or external, generally within the aerodynamic profile of the wing or empennage piece.

Although in the foregoing much attention is paid to aeronautical applications, the actuator of the invention is also suitable for application in other areas, such as precision microscope stage manipulation devices, surgical and commercial electric knives, helicopter and wind turbine rotor blade trim and full flight control, robotics and prosthetics manipulators.

The invention claimed is:

1. An actuator comprising:
 a) a support beam (10);
 b) a first means for placing said support beam (10) in compression without causing flexure of said support beam;
 c) a first layer of material (90) directly or indirectly adhered to a first surface of said support beam (10), wherein at least on the side of the first layer of material facing away from the support beam a stiff facing ply (110) is applied and further wherein between the first layer of material (90) and the stiff facing ply (110) a separating non-stick layer (100) is applied; and
 d) a second means for causing movement of said first layer of material to cause a flexure of said layer of material and said support beam, wherein said first layer of material (90) evidences a thermal coefficient of expansion that is different than a thermal coefficient of expansion of said support beam (10), characterized in that the actuator is designed to operate at a first working temperature whilst in a preceding manufacturing process the first layer of material (90) is structurally connected to the support beam (10) at a second temperature wherein the second temperature is higher than the first temperature so as to cause that at the first temperature the said support beam (10) is in compression without causing flexure thereof.

2. Actuator according to claim 1, wherein a material of the support beam (10) is selected from the group steel, aluminum, titanium foil, graphite-epoxy composite sheet.

3. Actuator according to claim 2, wherein the first layer of material (90) is selected to possess a coefficient of thermal expansion which is less than the coefficient of thermal expansion of the support beam (10).

4. Actuator according to claim 1, wherein the first layer of material (90) is selected to possess a coefficient of thermal expansion which is less than the coefficient of thermal expansion of the support beam (10).

5. Actuator according to claim 4, wherein the first layer of material is selected from the group comprising piezoelectric, electrorestrictive, shape-memory alloy materials.

6. Actuator according to claim 1, wherein the separating non-stick layer (100) is teflon.

7. Actuator according to claim 1, wherein the actuator is connected to a structural element via an end attachment (170) which is housed in a slot (180) of said structural element.

8. Actuator according to claim 1, wherein on a first end the actuator is connected to an elastomeric compression bushing (230) supported on a base structural mount (220), and on a second end opposite to the first end the actuator connects to a forward bulkhead mount (210) and a control stub (240).

9. An actuator comprising:
 a) a support beam (10);
 b) a first means for placing said support beam (10) in compression without causing flexure of said support beam;
 c) a first layer of material (90) directly or indirectly adhered to a first surface of said support beam (10); and
 d) a second means for causing movement of said first layer of material to cause a flexure of said layer of material and said support beam, wherein said first layer of material (90) evidences a thermal coefficient of expansion that is different than a thermal coefficient of expansion of said support beam (10), characterized in that the actuator is designed to operate at a first working temperature whilst in a preceding manufacturing process the first layer of material (90) is structurally connected to the support beam (10) at a second temperature wherein the second temperature is higher than the first temperature so as to cause that at the first temperature the said support beam (10) is in compression without causing flexure thereof;
 wherein the actuator is connected to a structural element via an end attachment (170) which is housed in a slot (180) of said structural element.

10. An actuator comprising:
 a) a support beam (10);
 b) a first means for placing said support beam (10) in compression without causing flexure of said support beam;
 c) a first layer of material (90) directly or indirectly adhered to a first surface of said support beam (10); and
 d) a second means for causing movement of said first layer of material to cause a flexure of said layer of material and said support beam, wherein said first layer of material (90) evidences a thermal coefficient of expansion that is different than a thermal coefficient of expansion of said support beam (10), characterized in that the actuator is designed to operate at a first working temperature whilst in a preceding manufacturing process the first layer of material (90) is structurally connected to the support beam (10) at a second temperature wherein the second temperature is higher than the first temperature so as to cause that at the first temperature the said support beam (10) is in compression without causing flexure thereof;
 wherein on a first end the actuator is connected to an elastomeric compression bushing (230) supported on a base structural mount (220), and on a second end opposite to the first end the actuator connects to a forward bulkhead mount (210) and a control stub (240).

11. An actuator comprising:
 a) a support beam (10);
 b) a first means for placing said support beam (10) in compression without causing flexure of said support beam;
 c) a first layer of material (90) directly or indirectly adhered to a first surface of said support beam (10), wherein at least on the side of the first layer of material facing away from the support beam a stiff facing ply (110) is applied; and
 d) a second means for causing movement of said first layer of material to cause a flexure of said layer of material and said support beam, wherein said first layer of material (90) evidences a thermal coefficient of expansion that is different than a thermal coefficient of expansion of said support beam (10), characterized in that the actuator is designed to operate at a first working temperature whilst in a preceding manufacturing process the first layer of material (90) is structurally connected to the support beam (10) at a second temperature wherein the second temperature is higher than the first temperature so as to cause that at the first temperature the said support beam (10) is in compression without causing flexure thereof, wherein the actuator is connected to a structural element via an end attachment (170) which is housed in a slot (180) of said structural element.

12. An actuator comprising:
   a) a support beam (10);
   b) a first means for placing said support beam (10) in compression without causing flexure of said support beam;
   c) a first layer of material (90) directly or indirectly adhered to a first surface of said support beam (10), wherein at least on the side of the first layer of material facing away from the support beam a stiff facing ply (110) is applied; and
   d) a second means for causing movement of said first layer of material to cause a flexure of said layer of material and said support beam, wherein said first layer of material (90) evidences a thermal coefficient of expansion that is different than a thermal coefficient of expansion of said support beam (10), characterized in that the actuator is designed to operate at a first working temperature whilst in a preceding manufacturing process the first layer of material (90) is structurally connected to the support beam (10) at a second temperature wherein the second temperature is higher than the first temperature so as to cause that at the first temperature the said support beam (10) is in compression without causing flexure thereof, wherein on a first end the actuator is connected to an elastomeric compression bushing (230) supported on a base structural mount (220), and on a second end opposite to the first end the actuator connects to a forward bulkhead mount (210) and a control stub (240).

13. A method of operating an actuator comprising transmitting an activation command to a first layer of material (90) such that the first layer of material (90) extends or contracts in size thereby flexing a support beam (10), wherein the actuator comprises:
   a) the support beam (10);
   b) a first means for placing said support beam (10) in compression without causing flexure of said support beam;
   c) the first layer of material (90) directly or indirectly adhered to a first surface of said support beam (10), wherein at least on the side of the first layer of material facing away from the support beam a stiff facing ply (110) is applied and further wherein between the first layer of material (90) and the stiff facing ply (110) a separating non-stick layer (100) is applied; and
   d) a second means for causing movement of said first layer of material to cause a flexure of said layer of material and said support beam, wherein said first layer of material (90) evidences a thermal coefficient of expansion that is different than a thermal coefficient of expansion of said support beam (10), characterized in that the actuator is designed to operate at a first working temperature whilst in a preceding manufacturing process the first layer of material (90) is structurally connected to the support beam (10) at a second temperature wherein the second temperature is higher than the first temperature so as to cause that at the first temperature the said support beam (10) is in compression without causing flexure thereof.

14. The method of claim 13, wherein the activation command is transferred via the second means.

15. The method of claim 14, wherein the actuator further comprises a second layer of material directly or indirectly adhered to a second surface of said support beam (10) that is opposite the first surface and a third means for causing movement of said second layer of material.

16. The method of claim 15, further comprising transmitting a second activation command to the second layer of material such that the second layer extends or contracts in size thereby contributing to the flexing of the support beam (10).

17. The method of claim 16, wherein the second activation command is transferred via a second means.

18. The method of claim 17, wherein if the first activation command causes the first layer of material (90) to contract, the second activation command causes the second layer of material to extend, and wherein if the first activation command causes the first layer of material (90) to extend, the second activation command causes the second layer of material to contract.

19. The method of claim 18, wherein the actuator is coupled to one or more canards or fins such that when the support beam (10) is flexed, the one or more canards or fins pitch about a pivot line.

20. The method of claim 19, wherein the canards or fins are coupled to an aircraft, missile or munition such that through the pitching of the one or more canards or fins, the actuator is able to control the aircraft, missile or munition in pitch, roll and/or yaw.

* * * * *